United States Patent
Park

(10) Patent No.: US 6,340,623 B1
(45) Date of Patent: Jan. 22, 2002

(54) METHOD OF FABRICATING SEMICONDUCTOR DEVICE

(75) Inventor: Keun-Soo Park, Kyungki-do (KR)

(73) Assignees: Anam Semiconductor, Inc., Seoul (KR); Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/693,466

(22) Filed: Oct. 20, 2000

(30) Foreign Application Priority Data

Oct. 25, 1999 (KR) .............................. 99-46407

(51) Int. Cl.⁷ ...................... H01L 21/76; H01L 21/8244
(52) U.S. Cl. ...................... 438/427; 438/238; 438/435; 257/263
(58) Field of Search ................ 438/238, 424, 438/427, 435; 257/263

(56) References Cited

U.S. PATENT DOCUMENTS

| | | | |
|---|---|---|---|
| 5,225,358 A | * 7/1993 | Pasch | 438/238 |
| 5,453,635 A | 9/1995 | Hsu et al. | 257/336 |
| 5,472,894 A | 12/1995 | Hsu et al. | 437/44 |
| 5,789,769 A | * 8/1998 | Yamazaki | 257/263 |
| 5,879,980 A | * 3/1999 | Selcuk et al. | 438/238 |
| 5,972,758 A | 10/1999 | Liang | 438/294 |
| 6,020,621 A | 2/2000 | Wu | 257/506 |
| 6,184,105 B1 | * 2/2001 | Liu et al. | 438/424 |

* cited by examiner

*Primary Examiner*—Charles Bowers
*Assistant Examiner*—David S Blum

(57) ABSTRACT

In a method of fabricating a semiconductor device, a plurality of MOS devices are formed on a semiconductor substrate each with a source, a drain, and a gate electrode. A first insulating layer is formed on the semiconductor substrate with the MOS devices. A moat pattern is formed on the first insulating layer such that the portions of the first insulating layer placed at device isolation areas are exposed to the outside. Trenches are formed at the semiconductor substrate through etching the first insulating layer and the underlying semiconductor substrate using the moat pattern as a mask. The semiconductor substrate is partially etched by a predetermined depth. The trenches are filled up through forming a second insulating layer on the etched portions of the semiconductor substrate, and on the first insulating layer.

7 Claims, 4 Drawing Sheets

METHOD OF FABRICATING SEMICONDUCTOR DEVICE

BACKGROUND OF THE INVENTION (a) Field of the Invention

The present invention relates to a method of fabricating a semiconductor device and, more particularly, to a method of fabricating a semiconductor device which involves simplified processing steps while ensuring improved device reliability.

(b) Description of the Related Art

Generally, semiconductor devices are fabricated through isolating active regions from field regions at a semiconductor substrate, and forming numerous devices such as transistors at the isolated active regions on the substrate.

In order to perform the device isolation, a local oxidation of silicon (LOCOS) technique has been widely used in the semiconductor fabrication process. In the LOCOS technique, the semiconductor substrate itself suffers thermal oxidation using a nitride layer as a mask. However, in the application of the LOCOS technique, the so-called bird's beak occurs, and the device isolation area takes a large volume that limits device miniaturization.

In this connection, a shallow trench isolation (STI) technique has been suggested to replace the LOCOS technique. In the STI technique, shallow trenchs are made at the semiconductor substrate, and filled with an insulating material. In this way, the field regions can be limited to the relatively narrow trench formation area while making it possible to miniaturize the device dimension as much as possible.

FIGS. 1A to 1E sequentially illustrate the steps of fabricating a semiconductor device according to a prior art method.

As shown in FIG. 1A, a pad oxide layer 2, and a silicon nitride layer 3 are sequentially deposited onto a semiconductor substrate 1, and a moat pattern 4 is formed on the silicon nitride layer 3. The silicon nitride 3, the pad oxide layer 2, and the semiconductor substrate 1 are etched through photolithography using the moat pattern 4 as a mask to thereby form trenches 5. At this time, the semiconductor substrate 1 is partially etched to a desired depth. Thereafter, the moat pattern 4 is removed, and as shown in FIG. 1B, a trench thermal-oxide layer 6 is formed on the inner wall (specifically, a floor and sidewalls) of each trench 5. The trenches 5 are then filled up through forming a trench oxide layer 7 onto the entire surface of the semiconductor substrate 1 using an atmospheric pressure chemical vapor deposition (APCVD) technique. Then, a reverse moat pattern 8 the phase of which is reversed by 180 degree compared to the moat pattern 4 is formed on the trench oxide layer 7.

The trench oxide layer 7 is then etched through photolithography using the reverse moat pattern 8 as a mask to thereby expose the underlying silicon nitride layer 3 to the outside. The reverse moat pattern 8 is removed, and as shown in FIG. 1C, the trench oxide layer 7 is planarized through chemical mechanical polishing (CMP) using the silicon nitride layer 3 as a buffer.

As shown in FIG. 1D, the silicon nitride layer 3 is removed through wet etching to thereby complete the trench isolation process. Thereafter, ion implantation for controlling threshold voltage, ion implantation for preventing punch-through, ion implantation for channel formation, and ion implantation for well formation are performed with respect to the semiconductor substrate 1.

As shown in FIG. 1E, the pad oxide layer 2 that is damaged due to the ion implantation is removed, and metal oxide semiconductor (MOS) devices 9 are formed at the active regions of the semiconductor substrate 1. Each MOS device is formed with a source 9a, a drain 9b, and a gate electrode 9c.

As shown in FIG. 1F, an insulating layer 10 is formed on the entire surface of the semiconductor substrate 1 with the MOS devices 9, and planarized through CMP.

In the above process, when the trench oxide layer 7 is planarized through CMP, torn oxide or scratches may occur, resulting in deteriorated device reliability.

SUMMARY OF THE INVENTION

It is an object of the present invention to provide a method of fabricating a semiconductor device which involves simplified processing steps while preventing processing failure accruing to chemical mechanical polishing.

These and other objects may be achieved by a method in accordance with the present invention of fabricating a semiconductor device. In one embodiment, a plurality of devices are first formed at the semiconductor substrate, and an insulating layer is then deposited onto the substrate with the devices. Trenches are formed at the substrate for electrically isolating one device from another.

BRIEF DESCRIPTION OF THE DRAWINGS

A more complete appreciation of the invention, and many of the attendant advantages thereof, will be readily apparent by reference to the following detailed description in conjunction with the accompanying drawings, in which like reference symbols indicate the same or the similar components, wherein.

DETAILED DESCRIPTION OF THE EXEMPLARY EMBODIMENTS

The present application claims priority to Korean Patent Application No. 1999-46407, which was filed with the Korea Industrial Property Office on Oct. 25, 1999, and is incorporated herein by reference in its entirety.

Exemplary embodiments of this invention will be explained with reference to the accompanying drawings. FIGS. 2A to 2E sequentially illustrate the steps of processing a semiconductor device according to an embodiment of the present invention.

Figure 1A:
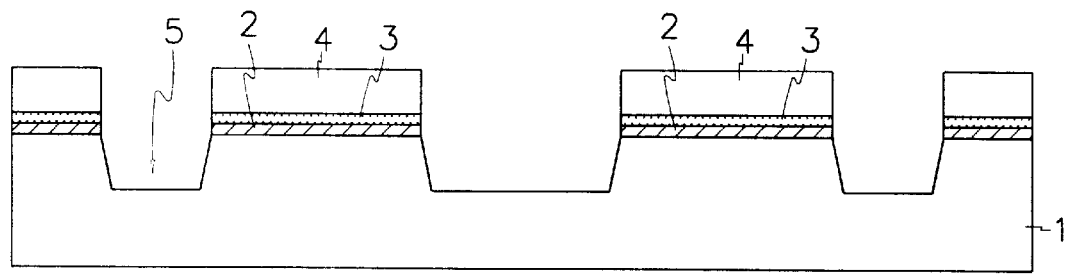
FIGS. 1A to 1F are schematic views illustrating the steps of fabricating a semiconductor device in a sequential manner according to a prior art method.
Figure 1B:
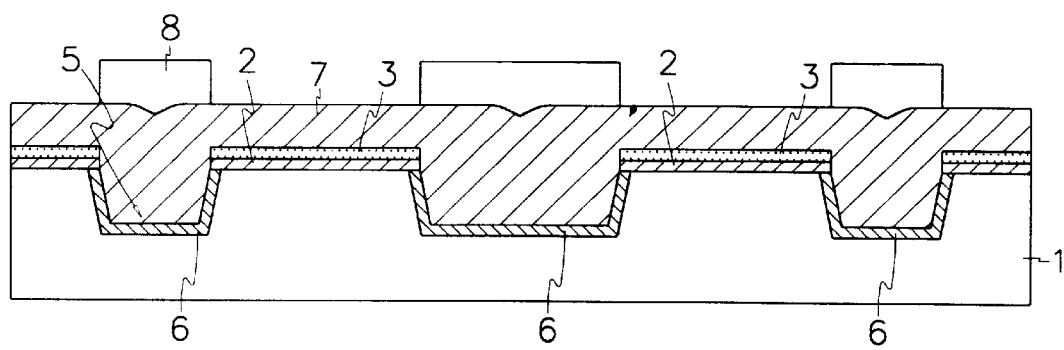
Figure 1C:
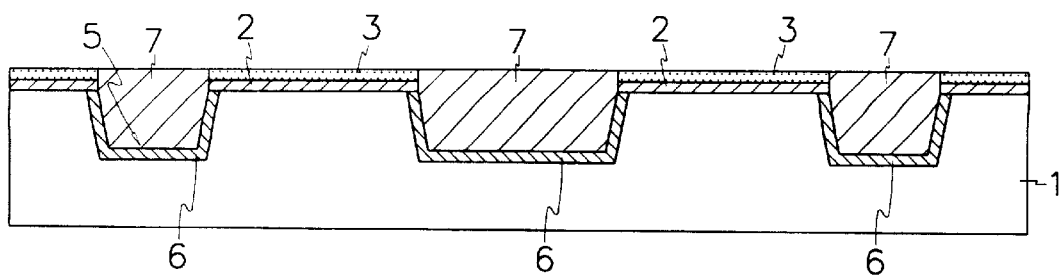
Figure 1D:
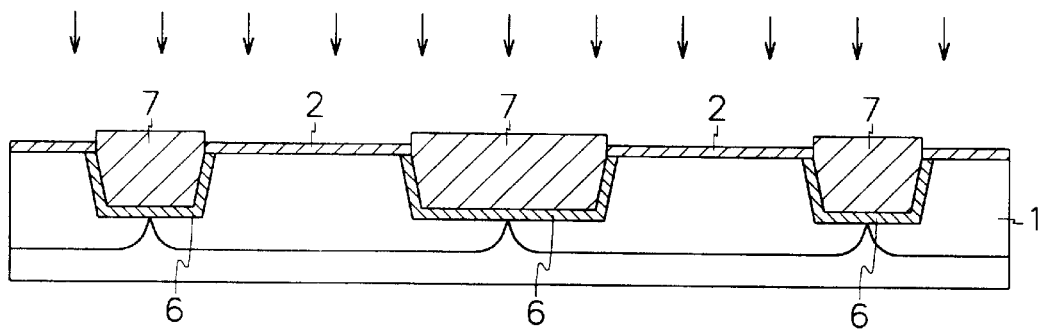
Figure 1E:
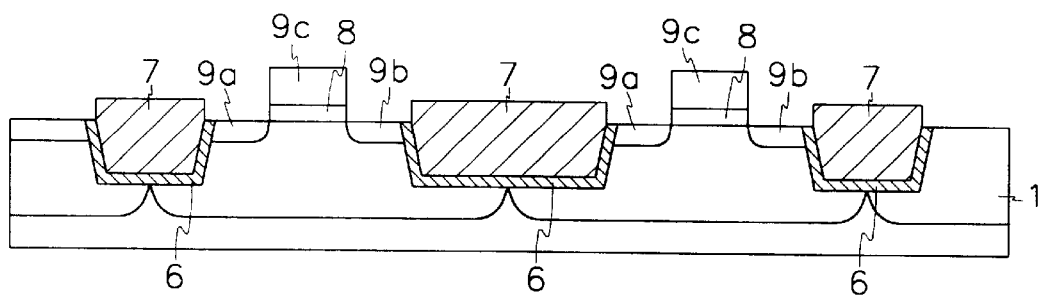
Figure 1F:
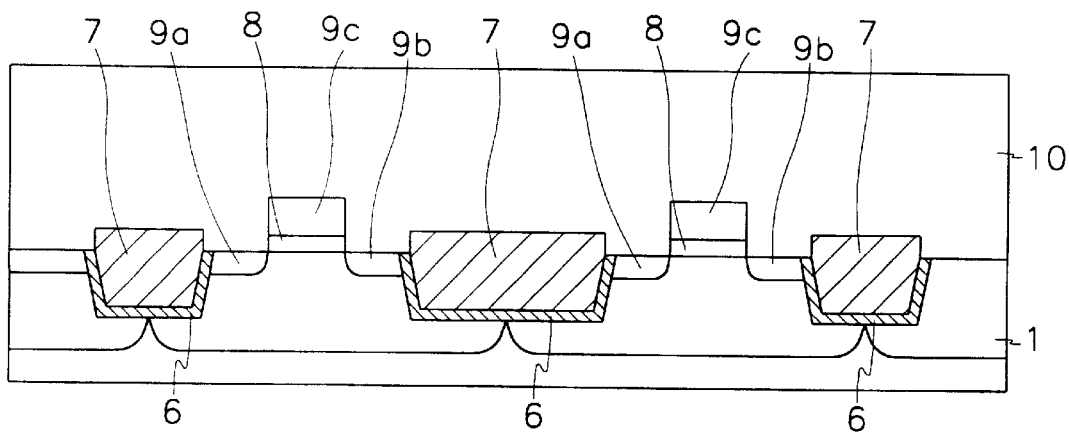
Figure 2A:
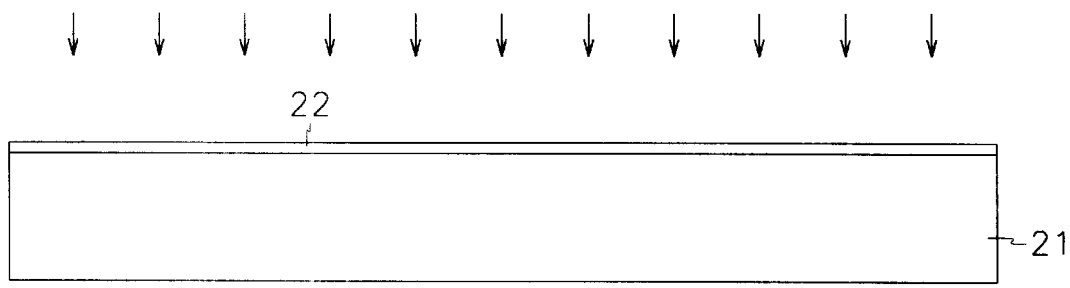
FIGS. 2A to 2F are views illustrating the steps of fabricating a semiconductor device in a/sequential manner according to a preferred embodiment of the present invention.

As shown in FIG. 2A, a pad oxide layer 22 is formed on a semiconductor substrate 21. Then, ion implantation for controlling threshold voltage, ion implantation for preventing punch-through, ion implantation for channel formation, and ion implantation for well formation are performed with respect to the semiconductor substrate 21 overlaid with the pad oxide layer 22.

Figure 2B:
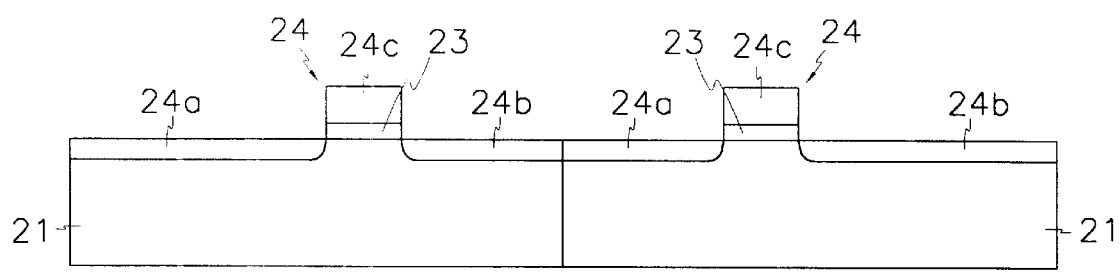

As shown in FIG. 2B, the pad oxide layer 22 that is damaged due to the ion implantation is removed, and a gate oxide layer 23 is formed on the entire surface of the semiconductor substrate 21. Then, MOS devices each with a source 24a, a drain 24b and a gate poly 24c are formed on the gate oxide layer 23. The portions of the gate oxide layer 23 over the source 23a and the drain 23b are removed while leaving out the portion of the gate oxide layer 23 under the gate poly 24c. Consequently, gate electrodes with the gate polys 24c and the gate oxide layer 23 are completed.

Figure 2C:
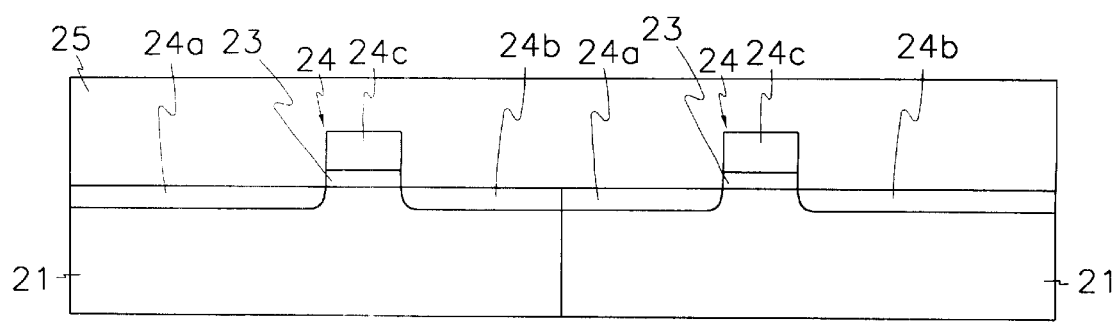

Thereafter, as shown in FIG. 2C, a first insulating layer 25 is formed on the entire surface of the semiconductor substrate 21 with the MOS devices, and is planarized through chemical mechanical polishing (CMP).

Figure 2D:
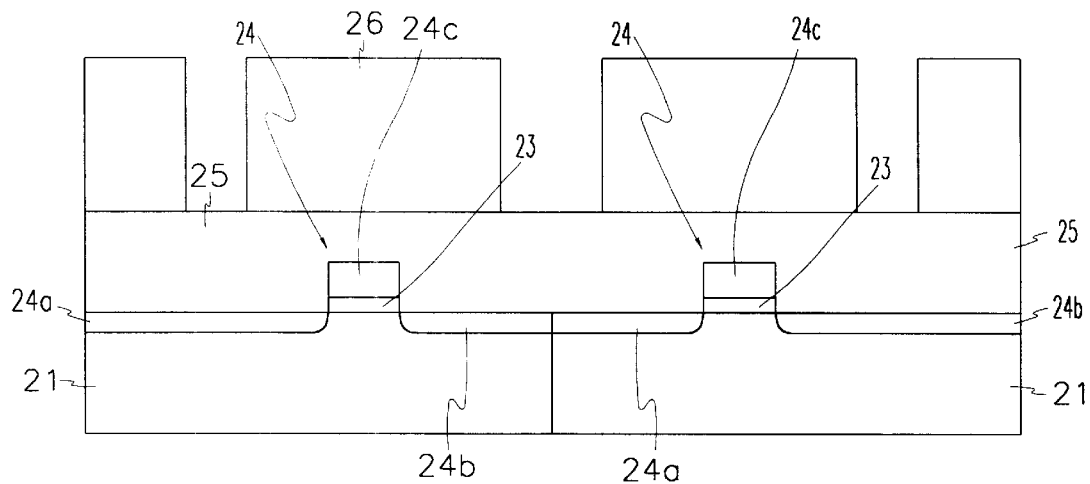

As shown in FIG. 2D, a photoresist moat pattern 26 is formed on the first insulating layer 25 such that the portion of the first insulating layer 25 at the isolation area is exposed to the outside.

Figure 2E:
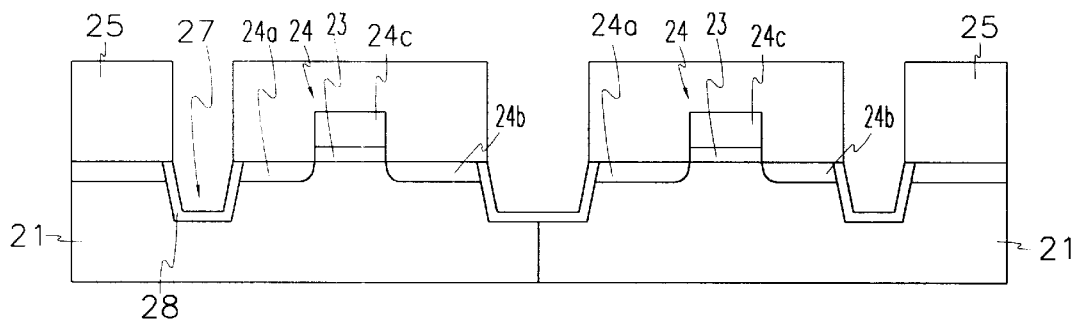

As shown in FIG. 2E, the first insulating layer 25, and the underlying semiconductor substrate 21 are sequentially etched through photolithography using the moat pattern 26 as a mask to thereby form trenches 27. At this time, the semiconductor substrate 21 is partially etched to a desired depth. The moat pattern 26 is then removed, and a trench thermal-oxide layer 28 is formed on the inner wall of each trench 27.

Figure 2F:
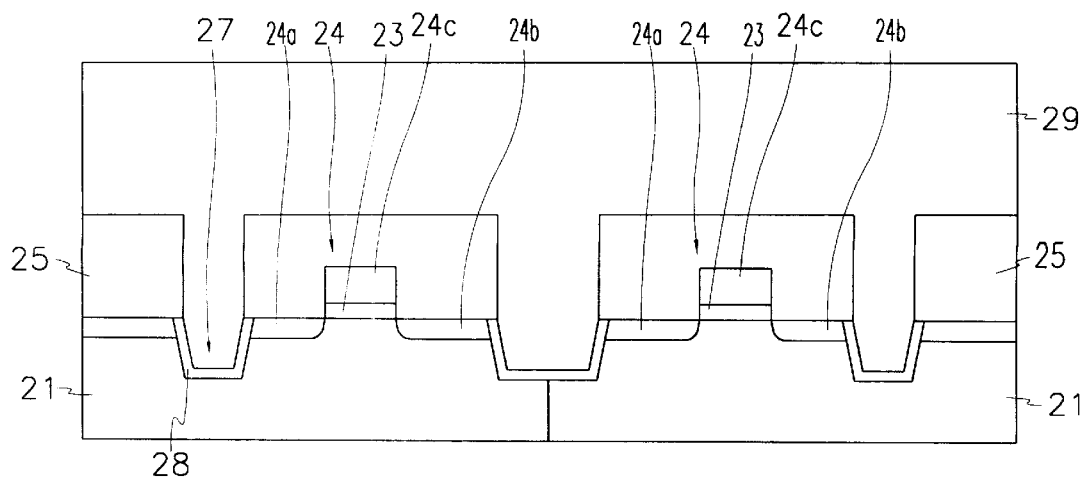

As shown in FIG. 2F, a second insulating layer 29 is formed on the first insulating layer 25 and the trenches 27 to thereby fill up the trenches 27. The second insulating layer 29 is planarized through CMP.

As examples, first insulating layer 25 and second insulating layer 29 can be the same materials or different materials. First insulating layer 25 and second insulating layer 29 are may be undoped oxide, or doped oxide such as BSG, PSG, or BPSG. Deposition may be done by LPCVD, PECVD, or HDCVD, among other possibilities.

As described above, in the inventive semiconductor device fabrication method, the desired devices are first formed on the semiconductor substrate, and then trenches are formed at the substrate while electrically isolating one device from another. In this way, the step of forming a silicon nitride layer, the step of forming a reverse moat pattern, the step of planarizing the trench filling insulating layer through CMP, and the step of removing the silicon nitride layer can be omitted compared to the conventional semiconductor processing. Consequently, the processing steps can be simplified while reducing production cost.

Particularly, torn oxide and scratches possibly occurring at the step of planarizing the trench filling layer can be prevented, resulting in improved device reliability and enhanced yield.

While the present invention has been described in detail with reference to the exemplary embodiments, those skilled in the art will appreciate that various modifications and substitutions can be made thereto without departing from the spirit and scope of the present invention as set forth in the appended claims.

What is claimed is:

1. A method of fabricating a semiconductor device, the method comprising:

forming a plurality of MOS devices on a semiconductor substrate, each MOS device comprising a source, a drain, and a gate electrode;

forming a first insulating layer on the semiconductor substrate with the MOS devices;

forming a moat pattern on the first insulating layer such that the portions of the first insulating layer placed at device isolation areas are exposed to the outside;

forming trenches at the semiconductor substrate through etching the first insulating layer and the underlying semiconductor substrate using the moat pattern as a mask, the semiconductor substrate being partially etched to a predetermined depth; and filling up the trenches through forming a second insulating layer on the etched portions of the semiconductor substrate, and on the first insulating layer.

2. The method of claim 1 further comprising planarizing the first insulating layer through chemical mechanical polishing.

3. The method of claim 2 further comprising planarizing the second insulating layer through performing chemical mechanical polishing.

4. The method of claim 1 further comprising planarizing the second insulating layer through performing chemical mechanical polishing.

5. The method of claim 1 further comprising planarizing the first insulating layer.

6. The method of claim 5 further comprising planarizing the second insulating layer.

7. The method of claim 1 further comprising planarizing the second insulating layer.

* * * * *